(12) United States Patent
Lin et al.

(10) Patent No.: US 12,218,017 B2
(45) Date of Patent: Feb. 4, 2025

(54) GLASS CARRIER HAVING PROTECTION STRUCTURE AND MANUFACTURING METHOD THEREOF

(71) Applicant: UNIMICRON TECHNOLOGY CORP., Taoyuan (TW)

(72) Inventors: Wen Yu Lin, Taoyuan (TW); Kai-Ming Yang, Taoyuan (TW); Pu-Ju Lin, Hsinchu (TW)

(73) Assignee: UNIMICRON TECHNOLOGY CORP., Taoyuan (TW)

(*) Notice: Subject to any disclaimer, the term of this patent is extended or adjusted under 35 U.S.C. 154(b) by 0 days.

(21) Appl. No.: 17/586,106

(22) Filed: Jan. 27, 2022

(65) Prior Publication Data
US 2023/0215772 A1 Jul. 6, 2023

(30) Foreign Application Priority Data
Dec. 30, 2021 (TW) .................. 110149512

(51) Int. Cl.
*C03C 17/00* (2006.01)
*C03C 17/22* (2006.01)
(Continued)

(52) U.S. Cl.
CPC ............ *H01L 23/15* (2013.01); *C03C 17/002* (2013.01); *C03C 17/225* (2013.01); *C03C 17/42* (2013.01);
(Continued)

(58) Field of Classification Search
CPC ....... H01L 23/15; H01L 23/10; H01L 23/291; C03C 17/002; C03C 17/225; C03C 17/42; C03C 2218/154; H05K 1/0306
See application file for complete search history.

(56) References Cited

U.S. PATENT DOCUMENTS

| | | | |
|---|---|---|---|
| 2006/0220212 A1* | 10/2006 | Chen | .................. H01L 25/0657 257/E25.023 |
| 2012/0034460 A1* | 2/2012 | Tamada | ................ H01L 31/049 428/355 N |

(Continued)

FOREIGN PATENT DOCUMENTS

| | | |
|---|---|---|
| CN | 102365756 A | 2/2012 |
| CN | 103936290 A * | 7/2014 |

(Continued)

OTHER PUBLICATIONS

Taiwan Patent Office "Office Action" issued on Aug. 1, 2022, Taiwan.

*Primary Examiner* — Humera N. Sheikh
*Assistant Examiner* — Kevin Ct Li
(74) *Attorney, Agent, or Firm* — WPAT, PC

(57) ABSTRACT

The invention discloses a glass carrier having a protection structure, comprising a glass body and a protection layer. The glass body has a top surface, a bottom surface, and a lateral surface. The protection layer covers the lateral surface of the glass body. The protection layer is a hard material with a stiffness coefficient higher than a stiffness coefficient of the glass body. The invention further discloses a manufacturing method of a glass carrier having a protection structure, comprising the following steps: covering the protection layer around the lateral surface of the glass body, wherein the protection layer is the hard material with the stiffness coefficient higher than the stiffness coefficient of the glass body.

5 Claims, 10 Drawing Sheets

(51) Int. Cl.
  *C03C 17/42* (2006.01)
  *H01L 23/10* (2006.01)
  *H01L 23/15* (2006.01)
  *H01L 23/29* (2006.01)
  *H05K 1/03* (2006.01)

(52) U.S. Cl.
  CPC ............ *H01L 23/10* (2013.01); *H01L 23/291* (2013.01); *C03C 2218/154* (2013.01); *H05K 1/0306* (2013.01)

(56) References Cited

U.S. PATENT DOCUMENTS

| | | | |
|---|---|---|---|
| 2012/0251838 A1* | 10/2012 | Chiang | ................... C23C 14/46 428/630 |
| 2013/0104956 A1 | 5/2013 | Chou | |
| 2014/0093711 A1* | 4/2014 | Paulson | ................ C03C 17/001 428/217 |
| 2019/0148250 A1* | 5/2019 | Yu | ........................... H01L 21/56 257/773 |
| 2020/0083591 A1* | 3/2020 | Hsieh | ..................... H01Q 21/30 |
| 2020/0111729 A1* | 4/2020 | Pan | ................... H01L 23/49827 |
| 2021/0043529 A1* | 2/2021 | Leitgeb | ............. H01L 21/67092 |

FOREIGN PATENT DOCUMENTS

| | | | | |
|---|---|---|---|---|
| CN | 110520770 A | | 11/2019 | |
| CN | 112351605 A | | 2/2021 | |
| EP | 536607 A2 * | | 4/1993 | ............. C03C 17/09 |
| TW | I502090 B | | 10/2015 | |
| TW | I701981 B | | 8/2020 | |
| WO | WO2007060314 A1 | | 5/2007 | |

\* cited by examiner

GLASS CARRIER HAVING PROTECTION STRUCTURE AND MANUFACTURING METHOD THEREOF

CROSS-REFERENCE TO RELATED APPLICATION(S)

This application claims the priority benefit of TW application serial No. 110149512 filed on Dec. 30, 2021, the entirety of which is hereby incorporated by reference herein and made a part of specification.

BACKGROUND OF THE INVENTION

1. Field of the Invention

The present invention relates to a protection structure and manufacturing method thereof, more particularly a glass carrier having a protection structure and a manufacturing method thereof.

2. Description of the Related Art

With reference to FIG. 9A, FIG. 9A discloses a perspective view of a chipped glass carrier. A glass carrier 2 is one of the most commonly used carriers for a circuit board structure 3. The glass carrier 2 is cheap, heat resistant, chemically resistant, easily obtainable, and conveniently designed for use. The glass carrier 2 is also often used as a temporary carrier in a circuit board manufacturing process. However, due to the fragile nature of glass material, the glass carrier 2 is easily chipped during a manufacturing process of the circuit board structure 3, a transfer process of the temporary carrier, or another follow-up step in a manufacturing process.

As described above, due to the fragile nature of the glass material, chipping and shattering happen most easily at an edge 21 of the glass carrier 2 when being bumped with force. As such, when the glass carrier 2 is chipped from a bump after the circuit board structure 3 has already been mounted on the glass carrier 2, an internal stress from the glass carrier 2 might impact the circuit board structure 3.

Furthermore, even if the chipping of the glass carrier 2 avoids impacting the circuit board structure 3, when the circuit board structure 3 is finalized and handed to a customer, the chipping of the glass carrier 2 is still evident to the customer. The chipping of the glass carrier 2 might cause the customer to lose confidence in the circuit board structure 3 and negatively affect customer impressions of the circuit board structure 3.

After the bump, even though the glass carrier 2 looks intact visually from outside, the glass carrier 2 may still very possibly suffer small cracks internally. These small cracks create internal stress and decrease reliability of the glass carrier 2.

With reference to FIG. 9B, FIG. 9B presents a perspective view of slicing of the glass carrier 2. A current way of dealing with the damaged edge 21 of the glass carrier 2 is to slice away the damaged edge 21 from the rest of the glass carrier 2 before shipping. However, the slicing of the glass carrier 2 is time consuming, and the slicing of the glass carrier 2 might also induce new internal stress to the glass carrier 2.

For the above reasons, a glass carrier having a protection structure and a manufacturing method thereof is desperately needed.

SUMMARY OF THE INVENTION

The present invention provides a glass carrier having a protection structure and a manufacturing method thereof.

A glass carrier having a protection structure of the present invention includes a glass body and a protection layer. The glass body includes a top surface, a bottom surface, and a lateral surface. The protection layer covers the lateral surface of the glass body. The protection layer is a hard material with a stiffness coefficient higher than a stiffness coefficient of the glass body.

A manufacturing method of a glass carrier having a protection structure of the present invention includes a step of:

mounting a protection layer around a lateral surface of a glass body, wherein the protection layer is made of a hard material with a stiffness coefficient higher than a stiffness coefficient of the glass body.

The manufacturing method of the present invention provides a fast, simple, and low-cost way of manufacturing the glass carrier having the protection structure by mounting a first protection layer around the lateral surface of the glass body; in other words, by surrounding the glass body with the first protection layer, the present invention increases an ability of the glass body to resist deformation and chipping.

Furthermore, apart from deploying the hard material of the first protection layer to resist surface deformation, heat, chemicals, and instability, the present invention further mounts a second protection layer on the first protection layer. The second protection layer is made of a soft material. With aforementioned protection layers made of both hard and soft materials, protection of the glass body is strengthened, and reliability of a carrier made of the glass body is increased.

DETAILED DESCRIPTION OF THE INVENTION

Figure 1:
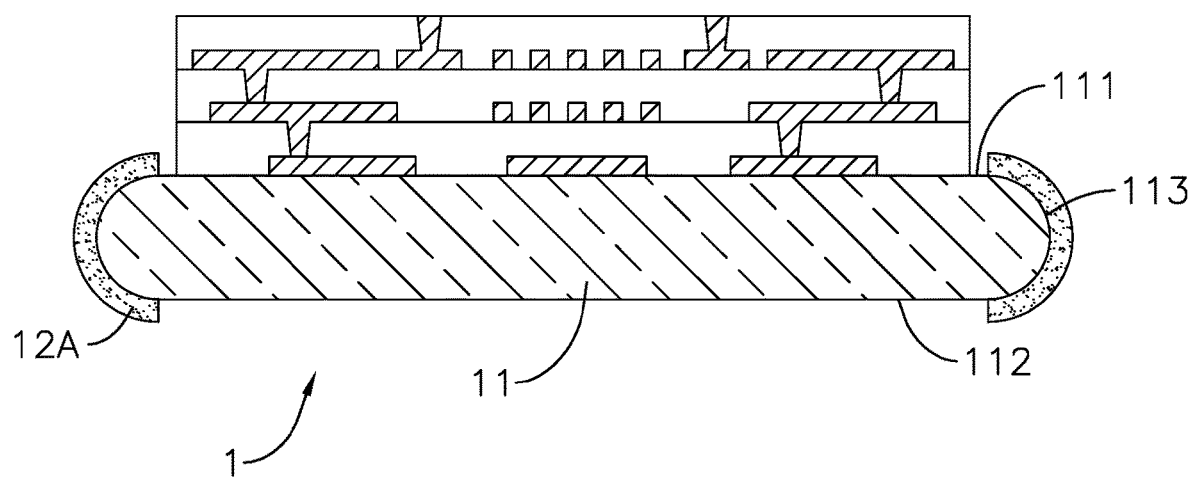
FIG. 1 is a cross-sectional perspective view of a first embodiment of a glass carrier having a protection structure of the present invention.

With reference to FIG. 1, a cross-sectional perspective view of a first embodiment of a glass carrier having a protection structure of the present invention is presented. The glass carrier having a protection structure 1 includes a glass body 11 and a first protection layer 12A. The glass body 11 includes a top surface 111, a bottom surface 112, and a lateral surface 113. In this embodiment, the top surface 111 is a carrying surface of the glass body 11. The first protection layer 12A fully covers the lateral surface 113 of the glass body 11; in other words, the first protection layer 12A surrounds the glass body 11. The first protection layer 12A is made of a hard material with a stiffness coefficient higher than a stiffness coefficient of the glass body 11. In this embodiment of the present invention, the first protection layer 12A is made of materials such as titanium nitride (TiN), chromium nitride (CrN), or diamond like carbon (DLC). As such, through having protection of the first protection layer 12A with stiffness coefficient higher than the stiffness coefficient of the glass body 11, the lateral surface 113 of the glass body 11 is protected from being chipped from bumping. In the present embodiment, a thickness of the first protection layer 12A is greater than or equal to 100 nanometers (nm).

Figure 2:
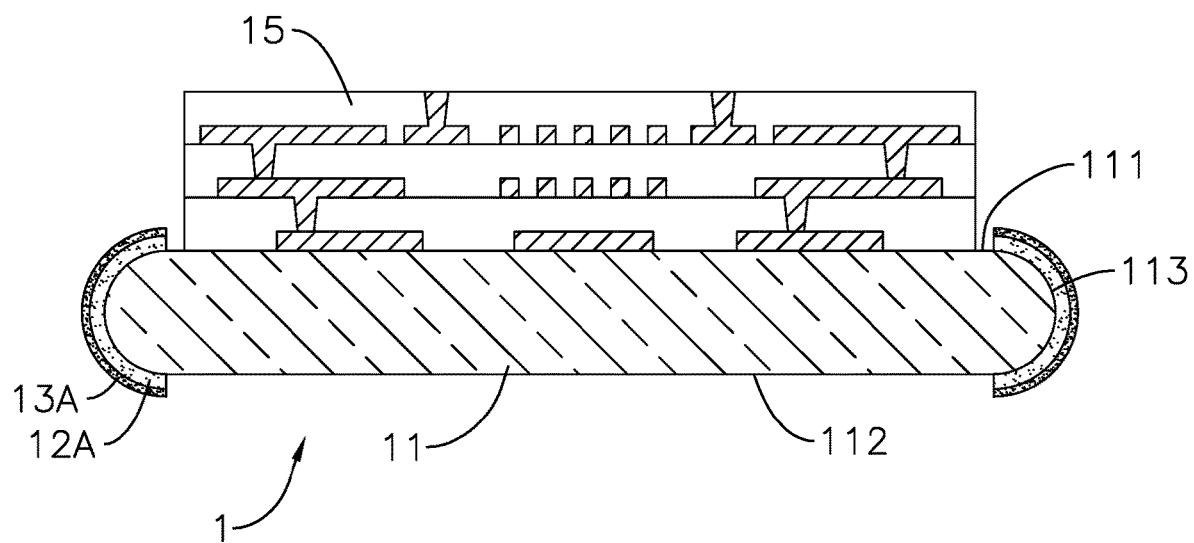
FIG. 2 is a cross-sectional perspective view of a second embodiment of the glass carrier having the protection structure of the present invention.

With reference to FIG. 2, a cross-sectional perspective view of a second embodiment of the glass carrier having a protection structure of the present invention is presented. In the second embodiment, the glass carrier having a protection structure 1 further includes a second protection layer 13A. The second protection layer 13A covers the first protection layer 12A. The second protection layer 13A is made of a soft material with a stiffness coefficient lower than the stiffness coefficient of the glass body 11. In this embodiment, the second protection layer 13A is made of epoxy.

Through having protections of both the first protection layer 12A with stiffness coefficient higher than the stiffness coefficient of the glass body 11 and the second protection layer 13A with stiffness coefficient lower than the stiffness coefficient of the glass body 11, when the hard material of the first protection layer 12A is bumped, a stress of the bump is prevented from penetrating into the glass body. In other words, the stress of the bump is more easily defused with the soft material of the second protection layer 13A, rather than staying focused and becoming an internal stress for the glass body 11. Furthermore, with the stress defused, the lateral surface 113 of the glass body 11 is also prevented from being chipped by the bump. In the present embodiment, a thickness of the second protection layer 13A is greater than or equal to 30 nm.

Figure 3:
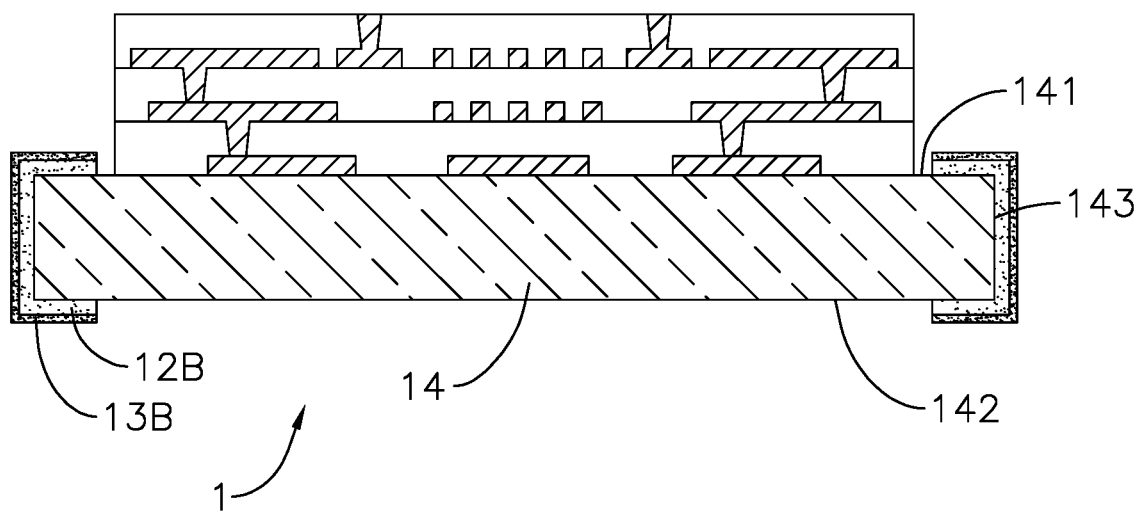
FIG. 3 is a cross-sectional perspective view of a third embodiment of the glass carrier having the protection structure of the present invention.

With reference to FIG. 3, a cross-sectional perspective view of a third embodiment of the glass carrier having a protection structure of the present invention is presented. In the third embodiment, a glass body 14 is rectangular. The glass body 14 includes a top surface 141, a bottom surface 142, and a lateral surface 143. Similar to the first embodiment and the second embodiment, here in the third embodiment, a first protection layer 12B also covers the lateral surface 143 of the glass body 14 in the glass carrier having a protection structure 1. In the third embodiment, the top surface 141 is also the carrying surface of the glass body 14. A second protection layer 13B also additionally covers the first protection layer 12B over the lateral surface 143 of the glass body 14. However different from the first embodiment and the second embodiment, here in the third embodiment the glass body 14 is cuboid. In the third embodiment, the first protection layer 12B covers the lateral surface 143, a part of the top surface 141, and a part of the bottom surface 142 of the rectangular glass body 14. In the first and second embodiments respectively, the lateral surface 113 of the glass body 11 is an arced surface, and so the first protection layer 12A and the second protection layer 13A both cover the lateral surface 113. In other words, an edge of the lateral surface 143 of the glass body 14 is free to be at a normal angle rather than being required to be grinded into the arced surface to be covered with the first protection layer 12A and the second protection layer 13A.

Figure 4A:
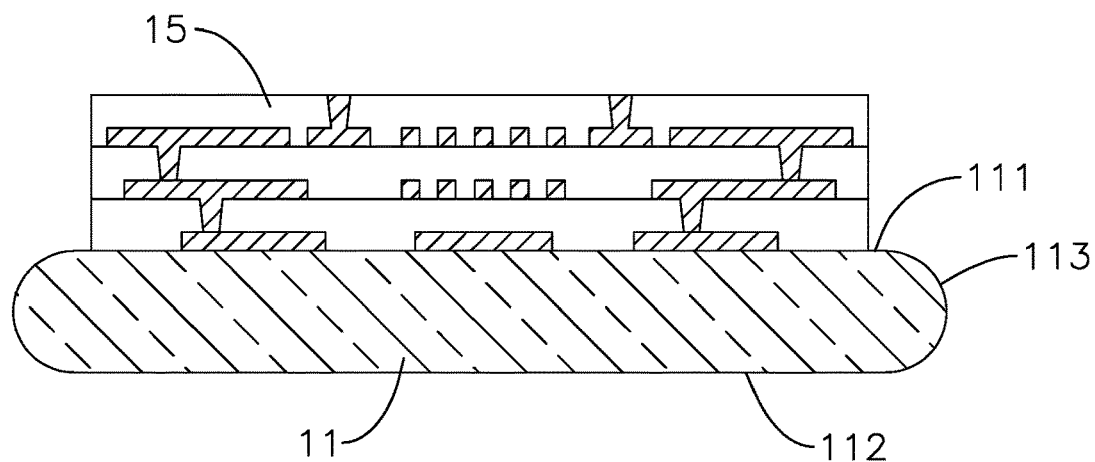
FIGS. 4A and 4B are flow charts of a manufacturing method of a glass carrier having a protection structure of the present invention.
Figure 4B:
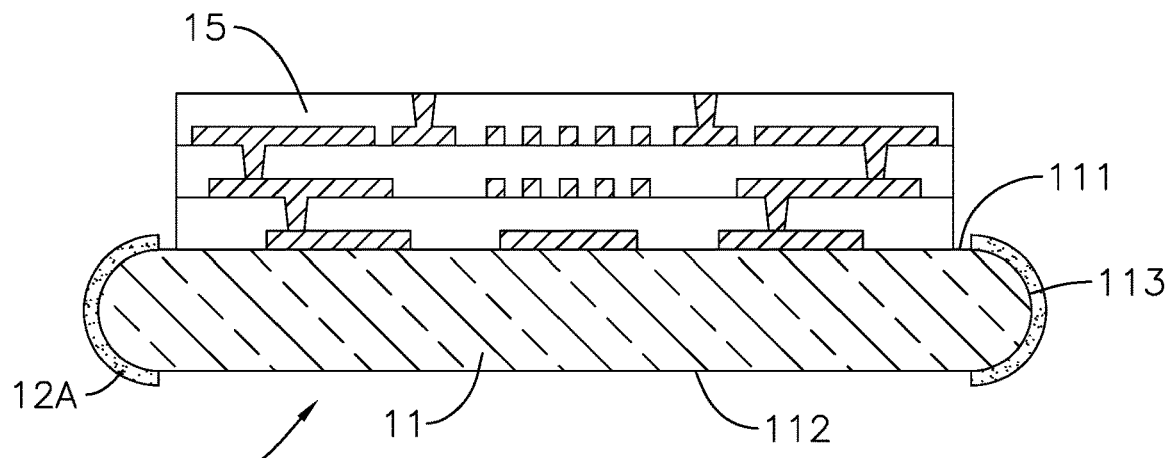

With reference to FIGS. 4A and 4B, flow charts of a manufacturing method of the glass carrier having the protection structure of the present invention are presented. The manufacturing method of the present invention includes the following steps:

In FIG. 4A, providing the glass body 11; and

In FIG. 4B, mounting the first protection layer 12A over the lateral surface 113 of the glass body 11. The first protection layer 12A is the hard material with the stiffness coefficient higher than the stiffness coefficient of the glass body 11.

Regarding the aforementioned embodiments, the manufacturing method of the present invention further includes the following step:

Mounting a circuit board structure 15 on the top surface 111 of the glass body 11 of the glass carrier having a protection structure 1.

Figure 4C:
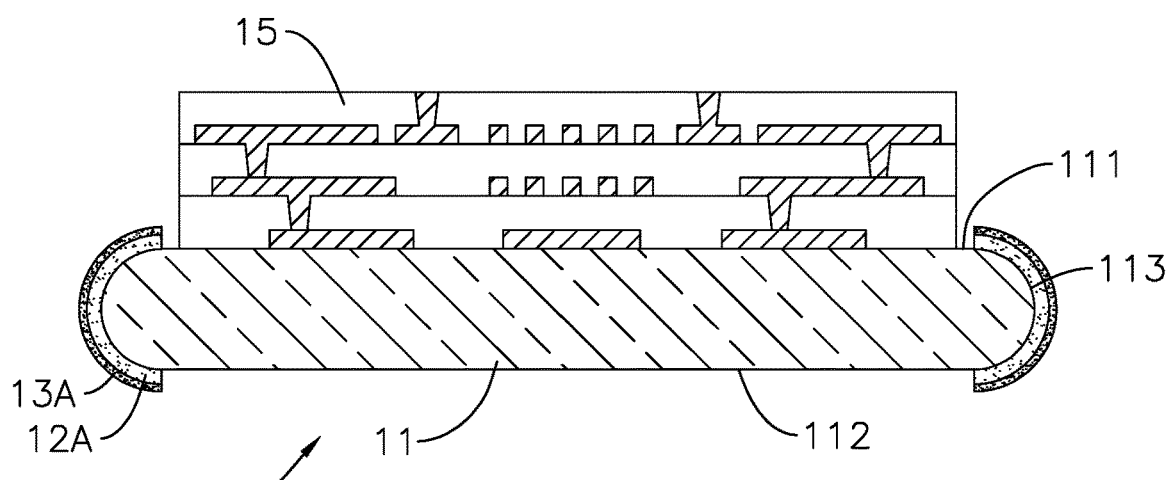
FIG. 4C is a perspective view of mounting a second protection layer of the manufacturing method of the present invention.

With reference to FIG. 4C, a perspective view of mounting the second protection layer 13A is presented. The manufacturing method of the present invention further includes a step of:

mounting the second protection layer 13A on the first protection layer 12A for strengthening the glass body 11. The second protection layer 13A has a stiffness coefficient lower than the stiffness coefficient of the glass body 11.

Figure 5A:
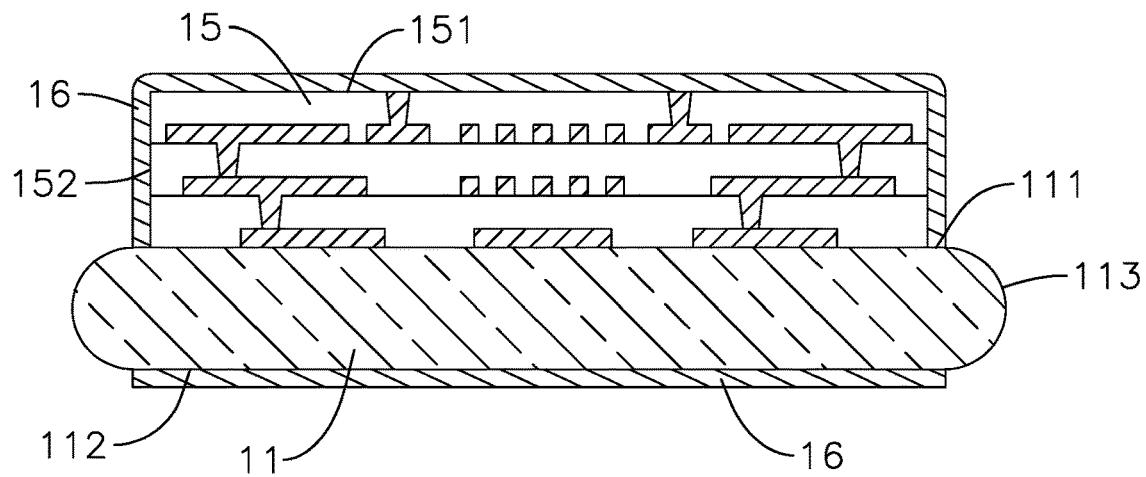
FIGS. 5A to 5C are flow charts of mounting a protection layer around a lateral surface of a glass body in the first embodiment of the present invention.
Figure 5B:
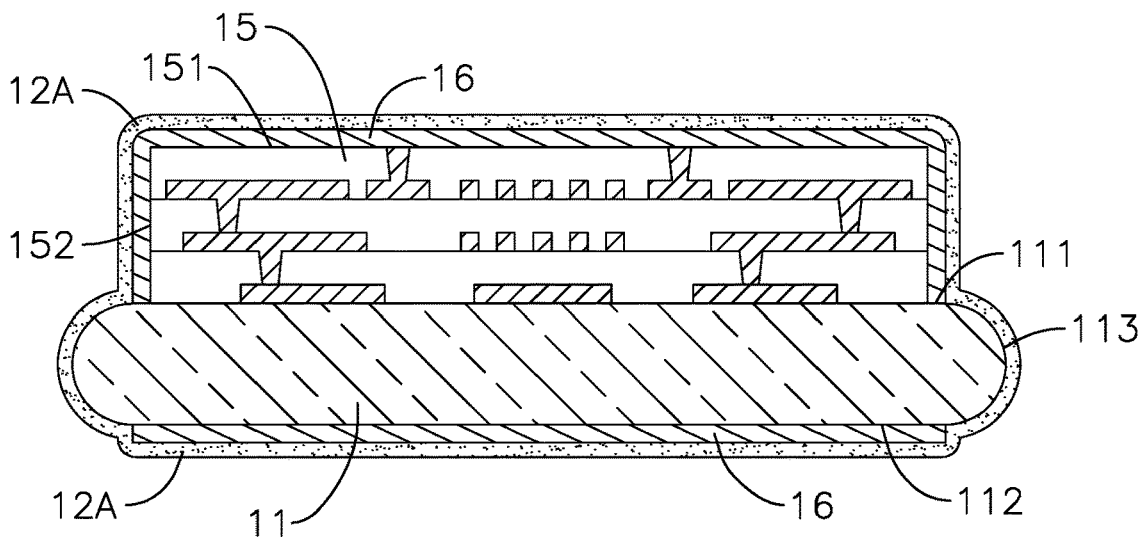
Figure 5C:
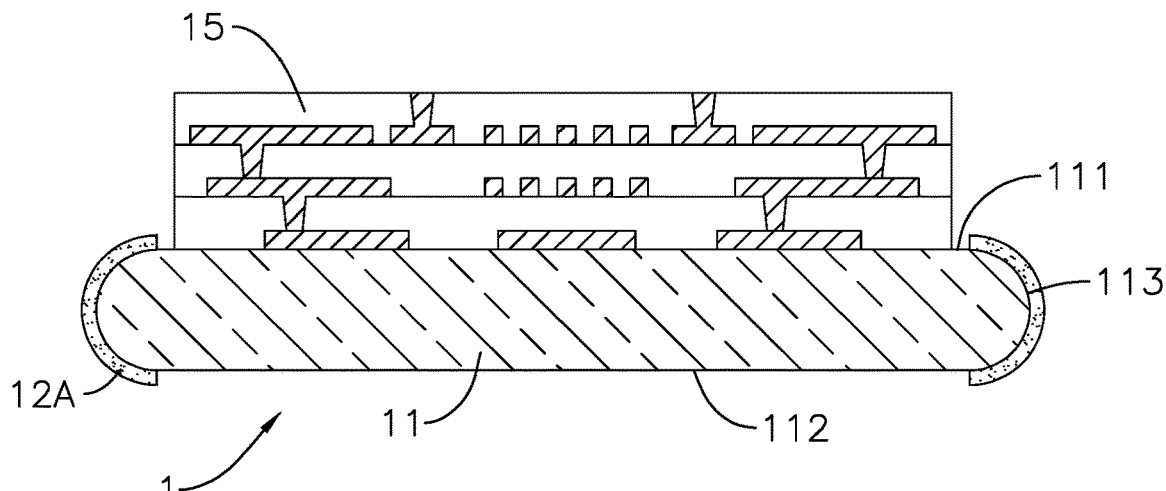

Regarding the current embodiment corresponding to FIGS. 4A to 4C, the first protection layer 12A of the present invention is mounted through a protection film. In FIGS. 5A to 5C, flow charts are presented for mounting the protection film 16 in regards to the current embodiment. In another embodiment of the present invention, a protection shell is mounted over the circuit board structure 15 and the glass body 11, exposing only the lateral surface 113 of the glass body 11 through the protection shell. This way the first protection layer 12A can cover the lateral surface 113 of the glass body 11 solely without covering other surfaces. Furthermore, since the point is to cover the first protection layer 12A over the lateral surface 113 of the glass body 11, the manufacturing method of the present invention further includes the following step before the step of mounting the first protection layer 12A around the lateral surface 113 of the glass body 11:

mounting the protection film 16 over the circuit board structure 15.

Instead of mounting the protection film 16 over the circuit board structure 15, the manufacturing method of the present invention can also use the following steps:

mounting the protection shell over the circuit board structure 15 and the glass body 11, exposing only the lateral surface 113 of the glass body 11; and once the first protection layer 12A is mounted, removing the protection shell.

Figure 4D:
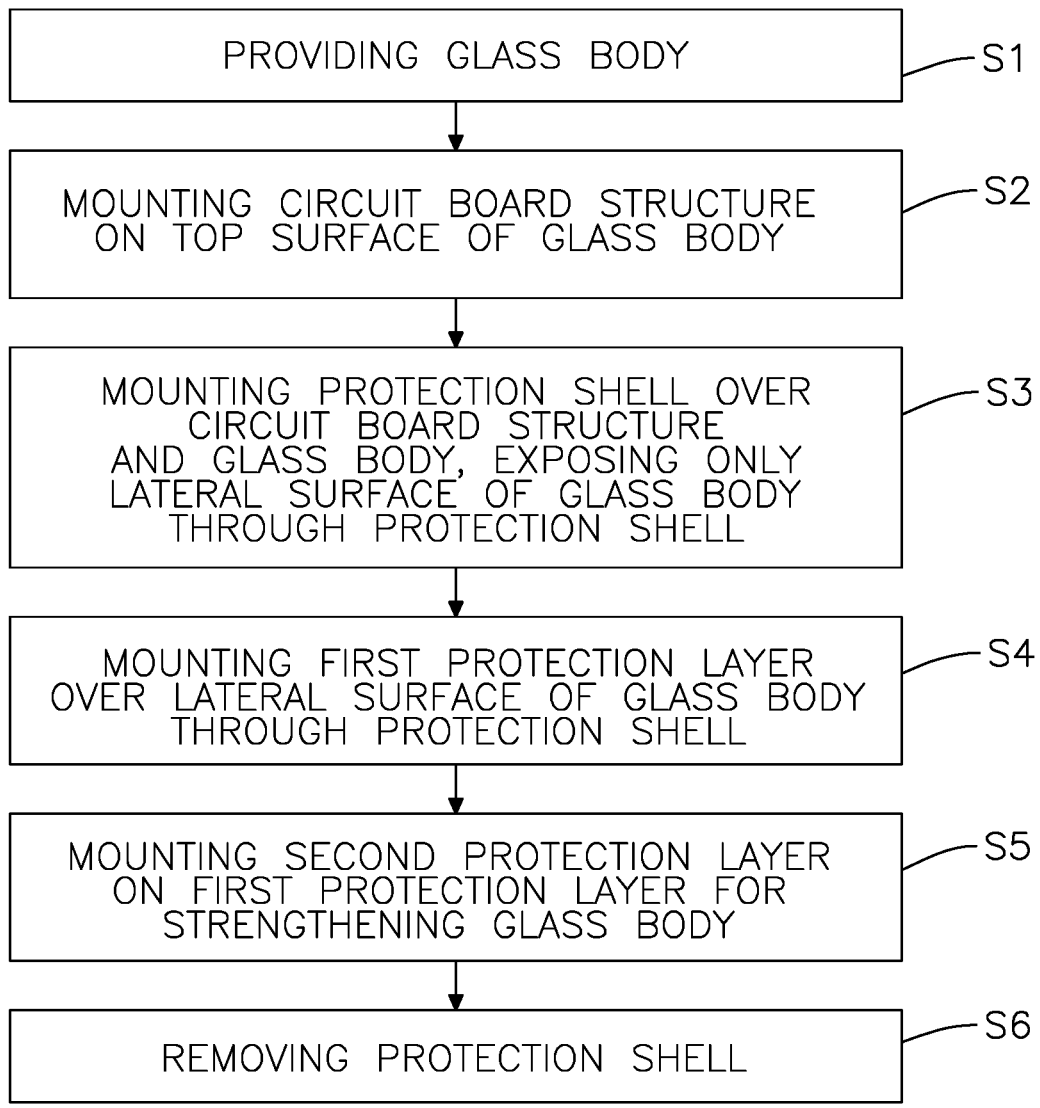
FIG. 4D is a flow chart of mounting the manufacturing method of the present invention.

With reference to FIG. 4D, in regard to the aforementioned steps, the following steps clarify an order of steps adopted in this embodiment:

Step S1: providing the glass body 11;

Step S2: mounting the circuit board structure 15 on the top surface 111 of the glass body 11;

Step S3: mounting the protection shell over the circuit board structure 15 and the glass body 11, exposing only the lateral surface 113 of the glass body 11 through the protection shell;

Step S4: mounting the first protection layer 12A over the lateral surface 113 of the glass body 11 through the protection shell;

Step S5: mounting the second protection layer 13A on the first protection layer 12A for strengthening the glass body 11; and Step S6: removing the protection shell.

With reference to FIGS. 5A to 5C, flow charts describing the step of mounting the first protection layer 12A around the lateral surface 113 of the glass body 11 in a first embodiment of the manufacturing method of the present invention are presented. In this embodiment, the present invention further includes the following steps:

In FIG. 5A, mounting the protection film 16 on a top surface 151 and a lateral surface 152 of the circuit board structure 15, and mounting the protection film 16 on the bottom surface 112 of the glass body 11.

In FIG. 5B, mounting the first protection layer 12A on the top surface 151 and the lateral surface 152 of the circuit board structure 15, and mounting the first protection layer 12A around the lateral surface 113 and the bottom surface 112 of the glass body 11. Note that since the protection film 16 already covers the bottom surface 112 of the glass body 11, here the first protection layer 12A covers the protection film 16 on the bottom surface 112 of the glass body 11.

In FIG. 5C, removing the protection film 16. In other words, remove the protection film 16 on the top surface 151 and the lateral surface 152 of the circuit board structure 15 along with the first protection layer 12A mounted on the protection film 16, and also remove the protection film 16 on the bottom surface 112 of the glass body 11 along with the first protection layer 12A mounted on the protection film 16.

Figure 6A:
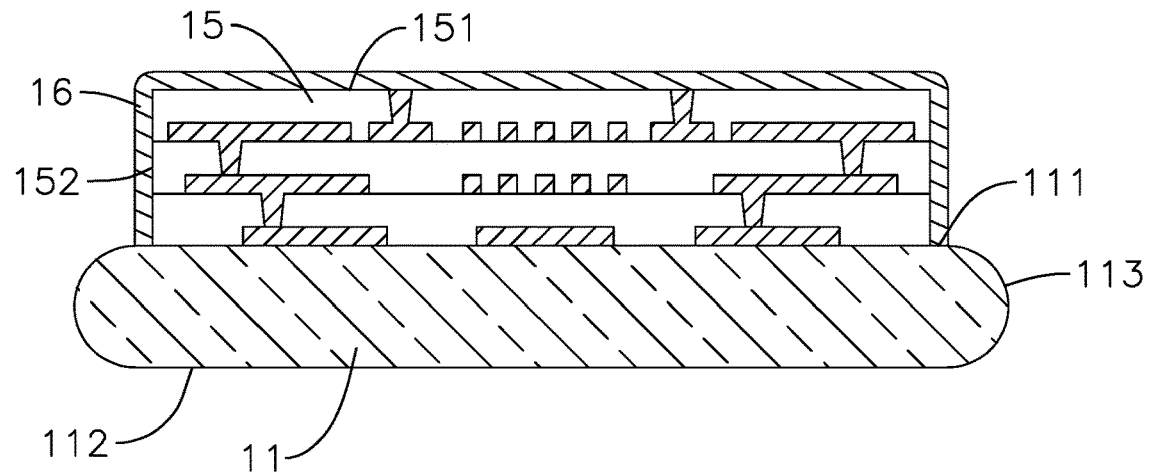
FIGS. 6A to 6C are flow charts of mounting the protection layer around the lateral surface of the glass body in the second embodiment of the present invention.
Figure 6B:
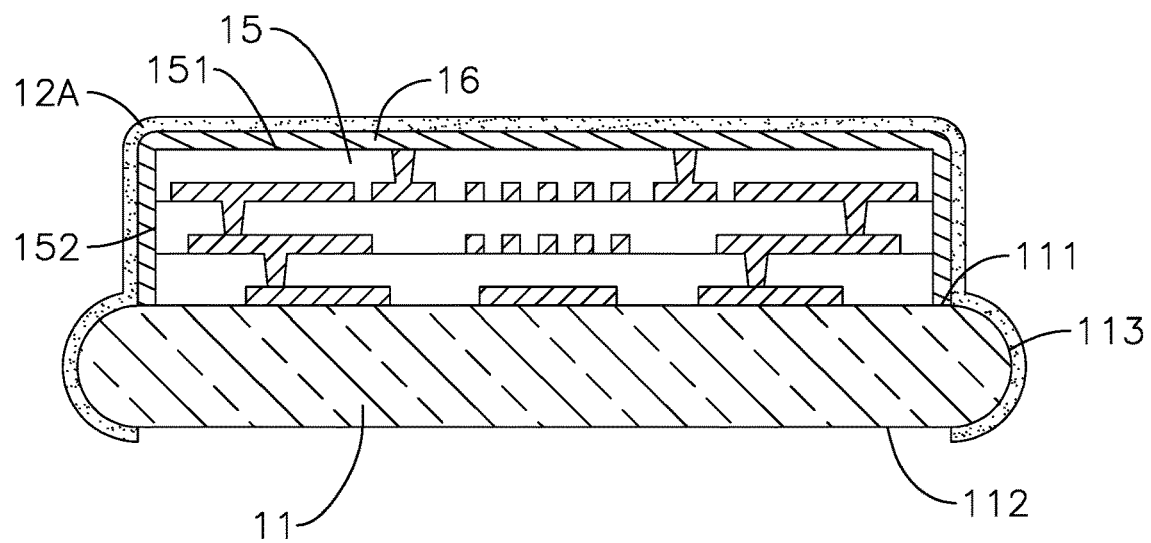
Figure 6C:
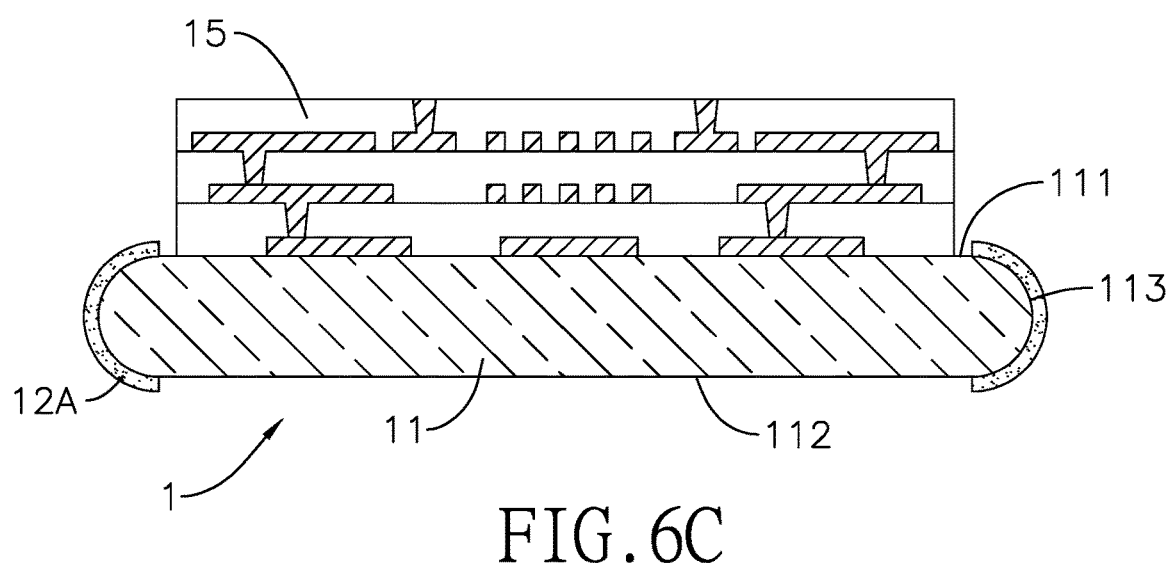

With reference to FIGS. 6A to 6C, flow charts describing the step of mounting the first protection layer 12A around the lateral surface 113 of the glass body 11 in a second embodiment of the manufacturing method of the present invention is presented. In this embodiment, the present invention further includes the following steps:

In FIG. 6A, mounting the protection film 16 on the top surface 151 and the lateral surface 152 of the circuit board structure 15.

In FIG. 6B, mounting the first protection layer 12A on the top surface 151 and the lateral surface 152 of the circuit board structure 15, and mounting the first protection layer 12A around the lateral surface 113 of the glass body 11.

In FIG. 6C, removing the protection film 16. In other words, remove the protection film 16 on the top surface 151 and the lateral surface 152 of the circuit board structure 15 along with the first protection layer 12A mounted on the protection film 16. In comparison to the first embodiment of the manufacturing method described in FIGS. 5A to 5C, here in the second embodiment described in FIGS. 6A to 6C the manufacturing method avoids mounting the protection film 16 and the first protection layer 12A on the bottom surface 112 of the glass body 11. This decreases manufacturing cost by decreasing material used in the manufacturing process.

Furthermore, in another embodiment of the present invention, the first protection layer 12A can also be directly mounted on the bottom surface 112 of the glass body 11, without having to mount the protection film 16 and to then remove the first protection layer 12A on the bottom surface 112 of the glass body 11 as previously described. In another embodiment of the present invention, other protective materials may be additionally mounted on the bottom surface 112 of the glass body 11 apart from the first protection layer 12A.

In this embodiment, the protection film 16 is a dry film. The dry film allows the protection film 16 to be easily removed from the glass body 11 along with the first protection layer 12A.

In this embodiment, the first protection layer 12A is mounted around the lateral surface 113 of the glass body 11 by sputtering. In another embodiment of the present invention, the first protection layer 12A is mounted around the lateral surface 113 of the glass body 11 by roll coating.

Figure 7:
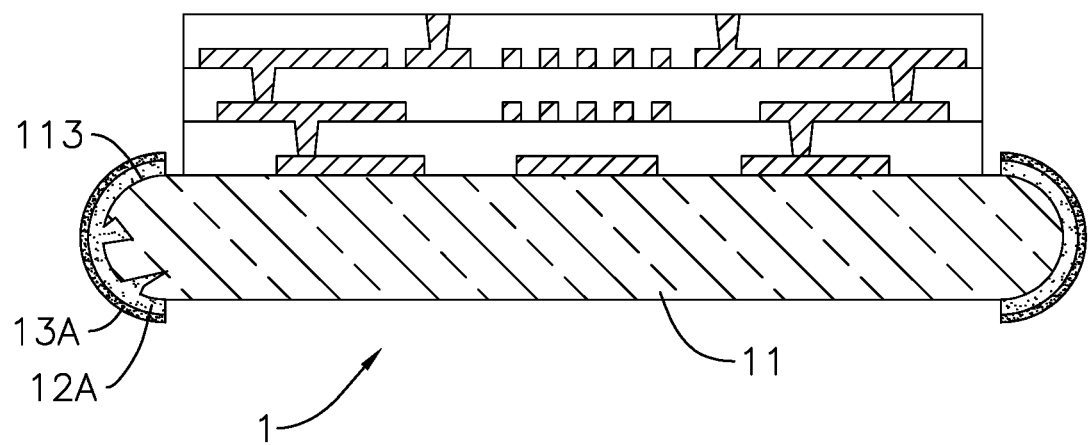
FIG. 7 is a cross-sectional perspective view of mounting the first protection layer on a chipped glass carrier in the present invention.

With reference to FIG. 7, a cross-sectional perspective view of mounting the first protection layer 12A on a chipped glass carrier in the present invention is presented. Since the chipping of the glass body 11 includes internal damages inside the glass body 11 or external minuscule cracks on the glass body 11, human eyes might fail to detect these damages. For ease of demonstration, the chipping damages of the glass body 11 are significantly enlarged in FIG. 7 to provide a perspective view. In this embodiment, the first protection layer 12A and the second protection layer 13A are both still mounted around the lateral surface 113 of the glass body 11 despite the lateral surface 113 of the glass body 11 has been damaged. With an adhesive force created by the first protection layer 12A and the second protection layer 13A mounted on the glass body 11, the chipping damages of the lateral surface 113 are controlled from expanding. On the other hand, even if the glass body 11 sustains visible chipping damages and cracks, by mounting the first protection layer 12A and the second protection layer 13A, the chipping damages and cracks would be covered and enveloped. This way the present invention is able to aesthetically improve how the glass body 11 looks.

Figure 8:
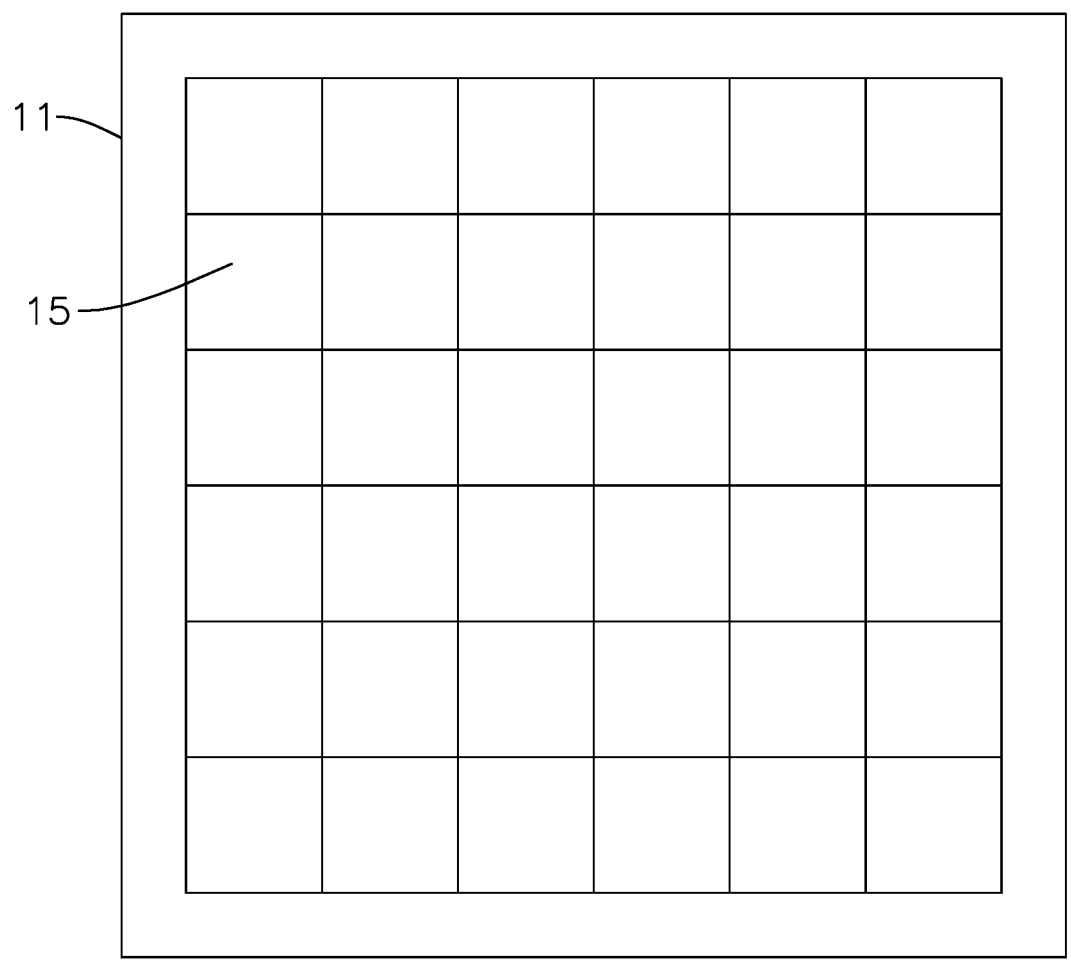
FIG. 8 is a top perspective view of mounting a circuit board structure on the glass carrier.
Figure 9A:
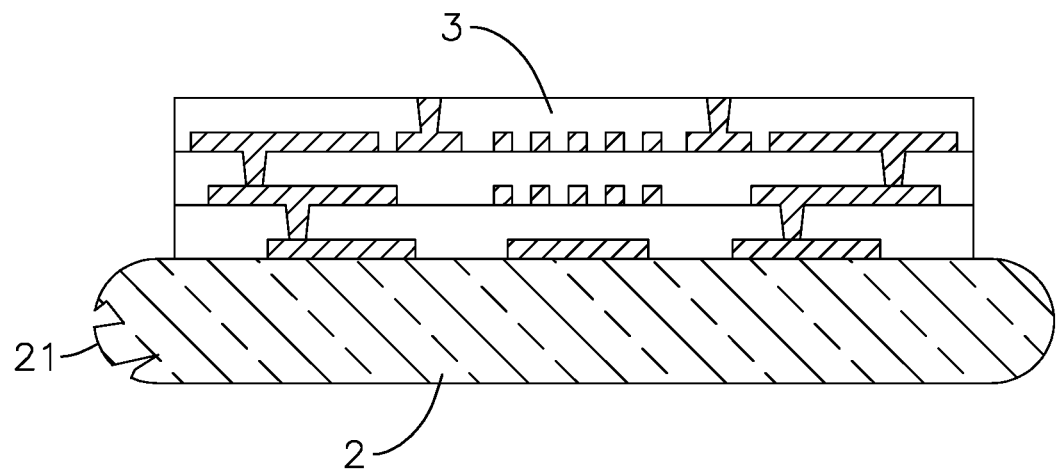
FIG. 9A is a perspective view of a chipped glass carrier.
Figure 9B:
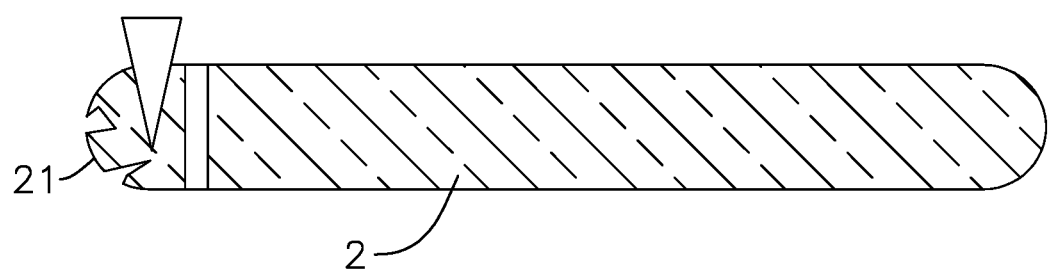
FIG. 9B is a perspective view of slicing of the glass carrier.

With reference to FIG. 8, a top perspective view of mounting the circuit board structure 15 on the glass carrier 11 is presented. In practice, a manufacturing process of the circuit board structure 15 is a large scale manufacturing process. In other words, a large scale circuit board structure contains a plurality of the circuit board structures 15, and the large scale circuit board structure is mounted on the glass body 11. The large scale circuit board structure along with the glass body 11 would need to be cut into multiple smaller units with the following step:

Cutting the glass body 11 into multiple smaller units. Each of the smaller units includes a glass unit and the circuit board structure 15 mounted on the glass unit. A glass unit is a smaller unit of the glass body 11. In other words, the step splits the plurality of the circuit board structures 15 to be the circuit board structure 15 placed on each of the multiple glass units.

During a process of cutting the glass body 11, the glass body 11 might be chipped due to fragility of glass material, and therefore protection layers are only mounted on the glass body 11 after the glass body 11 has been cut into each of the glass units. The first and second protection layers are mounted on the glass unit same way as previously described, and therefore further description is hereby omitted to avoid redundancy.

In conclusion, the manufacturing method of the present invention provides a fast, simple, and low-cost way of manufacturing the glass carrier having the protection structure. By mounting the first protection layer around the lateral surface of the glass body, in other words, by surrounding the glass body with the first protection layer, the present invention increases an ability of the glass body to resist deformation and chipping. Furthermore, apart from deploying the hard material of the first protection layer to resist surface deformation, heat, chemicals, and instability, the present invention further mounts the second protection layer as a soft material on the first protection layer. With aforementioned protection layers made of both hard and soft materials, an overall protection of the glass body is strengthened, and reliability of the glass carrier made of the glass body is increased.

What is claimed is:

1. A glass carrier having a dual lateral surface protection structure, comprising:
    a glass body, having a carrying surface, a bottom surface, and a lateral surface; wherein the carrying surface and the bottom surface are opposite, and the lateral surface connects the carrying surface and the bottom surface;
    a first protection layer, fully covering the lateral surface of the glass body; and
    a second protection layer, covering the first protection layer over the lateral surface of the glass body;
    a circuit board structure, mounted on the carrying surface of the glass body; and
    a protection shell, mounted over the circuit board structure and the glass body and exposing the dual lateral surface protection structure of the glass body;
    wherein the first protection layer is a hard material with a stiffness coefficient higher than a stiffness coefficient of the glass body and the second protection layer is a soft material with a stiffness coefficient lower than the stiffness coefficient of the glass body;
    wherein the first protection layer and the second protection layer are contactless with the circuit board structure.

2. The glass carrier having the dual lateral surface protection structure as claimed in claim 1, wherein:
    the first protection layer is made of titanium nitride (TiN), chromium nitride (CrN), or diamond like carbon (DLC).

3. The glass carrier having the dual lateral surface protection structure as claimed in claim 1, wherein:
    the glass body is cuboid, and the first protection layer covers the lateral surface, a part of the carrying surface, and a part of the bottom surface of the glass body.

4. The glass carrier having the dual lateral surface protection structure as claimed in claim 1, wherein:
    the lateral surface of the glass body is arced;
    the first protection layer is arced and covers the lateral surface;
    the second protection layer is arced.

5. The glass carrier having the dual lateral surface protection structure as claimed in claim 1, wherein:
    the second protection layer is made of epoxy.

* * * * *